US006800553B2

(12) United States Patent
Jung et al.

(10) Patent No.: US 6,800,553 B2
(45) Date of Patent: Oct. 5, 2004

(54) METHOD FOR MANUFACTURING A SILICIDE LAYER OF SEMICONDUCTOR DEVICE

(75) Inventors: Byung Hyun Jung, Seoul (KR); Hyoung Yoon Kim, Chungcheongbuk-do (KR)

(73) Assignee: Dongbu Electronics, Co., Ltd, Seoul (KR)

( * ) Notice: Subject to any disclaimer, the term of this patent is extended or adjusted under 35 U.S.C. 154(b) by 252 days.

(21) Appl. No.: 10/180,760

(22) Filed: Jun. 26, 2002

(65) Prior Publication Data

US 2003/0003731 A1 Jan. 2, 2003

(30) Foreign Application Priority Data

Jun. 28, 2001 (KR) .......................................... 2001-37355

(51) Int. Cl.[7] ............................................... H01L 21/44
(52) U.S. Cl. ....................... 438/682; 438/656; 438/658; 438/648; 438/683; 438/653
(58) Field of Search .................................. 438/682, 656, 438/658, 653, 648, 683, 528, 523, 655

(56) References Cited

U.S. PATENT DOCUMENTS

| | | | | |
|---|---|---|---|---|
| 6,110,821 A | * | 8/2000 | Kohara et al. | 438/648 |
| 6,150,249 A | | 11/2000 | Lee et al. | |
| 6,287,966 B1 | | 9/2001 | Liu et al. | |
| 6,482,737 B2 | * | 11/2002 | Hamanaka | 438/653 |
| 6,727,165 B1 | * | 4/2004 | Puchner et al. | 438/581 |

* cited by examiner

*Primary Examiner*—Matthew Smith
*Assistant Examiner*—Igwe U. Anya
(74) *Attorney, Agent, or Firm*—Timothy J Keefer; Seyfarth Shaw LLP

(57) ABSTRACT

Disclosed is a method for manufacturing a silicide layer of semiconductor device. The disclosed comprises the steps of: depositing a lower metal layer on the surface of semiconductor substrate and then, performing a plasma treatment; and depositing an upper metal layer on the plasma-treated lower metal layer and then, performing a thermal treatment process, thereby forming a silicide layer on the surface of semiconductor substrate.

19 Claims, 4 Drawing Sheets

METHOD FOR MANUFACTURING A SILICIDE LAYER OF SEMICONDUCTOR DEVICE

BACKGROUND OF THE INVENTION

1. Field of the Invention

The present invention relates to a method for manufacturing a semiconductor device and, more particularly, to a method for manufacturing a semiconductor device capable of forming a uniform silicide layer with low resistance in a highly-integrated semiconductor device.

2. Description of the Prior Arts

As is generally known, a silicide process is Performed to reduce sheet resistance on the surface of semiconductor device. For example, a silicide layer is additionally formed on the surface of gate electrode and source/drain regions to reduce RC delay time of MOS transistor.

Tungsten silicide ($WSi_2$), titanium silicide ($TiSi_2$) and cobalt silicide ($CoSi_2$) may be mentioned as examples of the silicide used in the semiconductor device. Especially, titanium silicie (hereinafter, referred to as Ti silicide) is widely used in junctions to improve the speed of signal process in a highly-integrated semiconductor device.

A conventional method for manufacturing a silicide layer of semiconductor device will be described in more detail with reference to accompanying drawings.

Referring to FIG. 1, a field oxide layer 12 is formed on a silicon substrate 10 to define an active region and an inactive region of semiconductor device.

And, a gate oxide layer 13 and a doped polysilicon layer are sequentially deposited on the active region of the silicon substrate 10 and patterned to form a gate electrode 14.

Subsequently, ion impurities are implanted into source/drain regions of the substrate in low concentration, thereby forming a LDD (Lightly Doped Drain) region 16 and then, a spacer 18 is formed on the side of the gate electrode 14 with a silicon oxide layer (SiO2) or a silicon nitride layer (Si3N4).

Then, source/drain regions 20 are formed by ion-implanting impurities in high concentration into the resulting structure having the spacer 18.

Referring to FIG. 2, a Ti layer 22 and a TiN layer 24 are deposited on the entire surface of the resulting structure with metal and then, a RTP (Rapid Thermal Process) is performed.

Therefore, as shown in FIG. 3, silicon on the gate electrode 14 and source/drain regions 20 generates silicide reaction with the Ti layer 22 and the TiN layer 24 by the RTP, thereby forming a Ti silicide layer (TiSix) 26 on the surfaces thereof.

Then, unreacted Ti layer 22 and the TiN layer 24 are removed to prevent Ti silicide layers 26a,26b of the gate electrode 14 and source/drain regions 20 from electrically being connected to each other.

As described above, it is possible to degrade the sheet resistance by the Ti silicide layer 26a on the gate electrode 14 and the Ti silicide layer 26b on the source/drain regions 20. Therefore, contact resistance is lowered in manufacturing wiring in contact with the gate electrode 14 and the source/drain regions 20.

However, it becomes difficult to form a uniform silicide layer when a line width of gate electrode is reduced by a design rule in a highly-integrated semiconductor device. This is because when stable silicide C54 phase is formed by phase transition of unstable silicide C49 phase, there is no nucleation space of C54 phase on C49 phase due to the reduced line width of gate electrode, thereby forming a dense Ti silicide layer having a irregular and discontinuous C54 phase on one nucleation site.

Therefore, according to the conventional method for manufacturing a silicide, irregular silicide layer is formed by a reduced line width of gate electrode, thereby increasing silicide resistance on the gate electrode and source/drain regions and generating leakage current which result in degradation of device properties.

SUMMARY OF THE INVENTION

Therefore, the present invention has been proposed to solve the above problems and it is the primary objective of the present invention to provide a method for manufacturing a silicide layer of semiconductor device having uniform silicde layers in a later thermal treatment process.

In order to accomplish the above objectives, a method of forming a silicde layer of semiconductor device according to the present invention comprises the steps of: depositing a lower metal layer on the surface of semiconductor substrate and then, performing plasma treatment; and depositing an upper metal layer on the plasma-treated lower metal layer and then, performing a thermal treatment process, thereby forming a silicide layer on the surface of semiconductor substrate.

And, a method for forming a silicide of semiconductor device according to the present invention comprises the steps of: forming a gate electrode of polysilicon layer on the upper part of semiconductor substrate; forming a spacer of insulation material on the sidewall of gate electrode; forming source/drain regions by ion-implanting impurities in both sides of substrate of gate electrode; depositing a lower metal layer on the entire surface of resulting structure and then, performing a plasma treatment with Ar or N2 gas; and depositing an upper metal layer on the upper part of lower metal layer and then, performing first and second thermal treatment processes, thereby removing a metal layer unreacted with silicon and forming a silicide layer on the upper part of gate electrode and source/drain.

DETAILED DESCRIPTION OF THE INVENION

The objects and features of the invention may be understood with reference to the following detailed description of an illustrative embodiment of the invention, taken together with the accompanying drawings.

Figure 1:
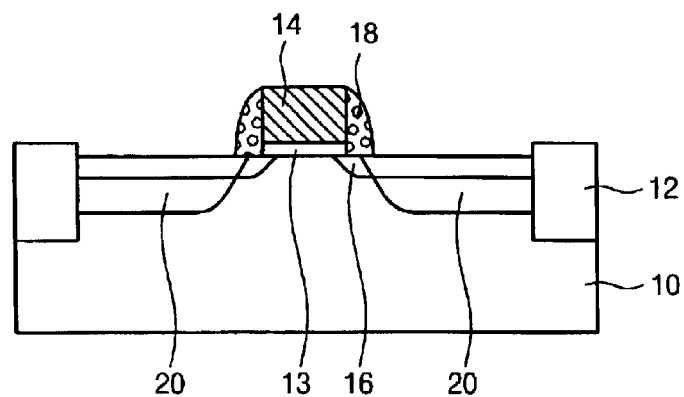
FIGS. 1 to 3 are drawings showing a conventional method for manufacturing a silicide layer of a semiconductor device.
Figure 2:
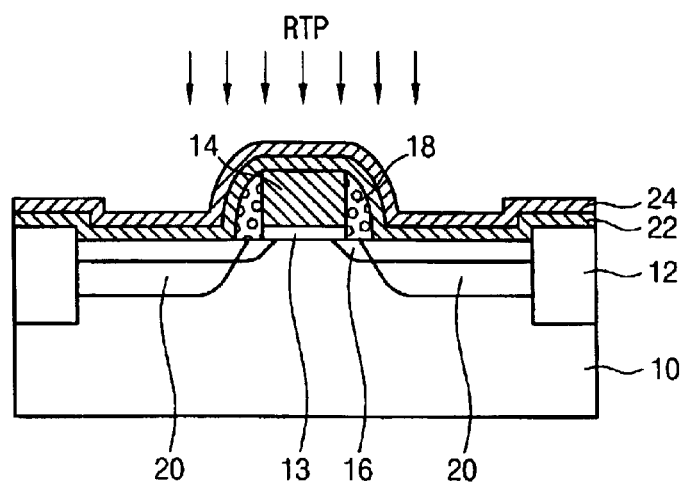
Figure 3:
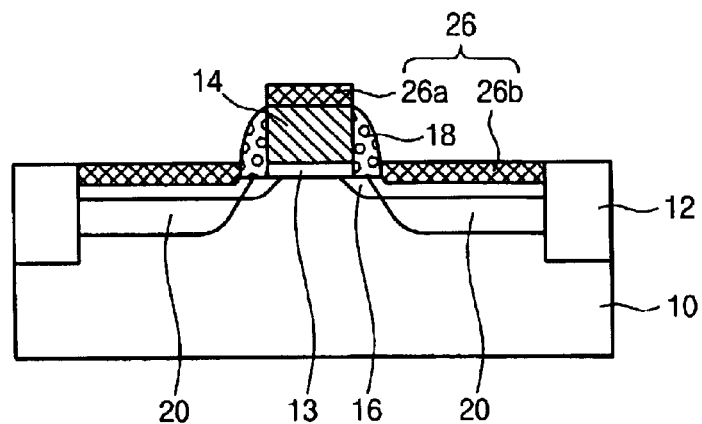
Figure 4:
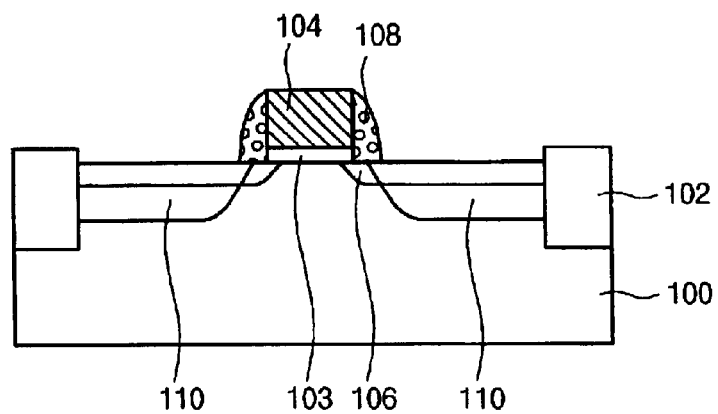
FIGS. 4 to 8 are sectional views showing a method for forming a silicide layer of a semiconductor device according to the present invention.

Referring to FIG. 4, a field oxide layer 102 is formed on a silicon substrate 100 to define an active region and an inactive region of device.

Then, a gate oxide layer 103 and a doped polysilicon layer are formed on the active region of the substrate 100 and then, patterned to form a gate electrode 104.

Subsequently, impurities are ion-implanted in low concentration into source/drain regions of substrate to form a LDD region 106 and a spacer 108 is formed on the side of gate electrode 104 with a silicon oxide layer SiO2 or a silicon nitride layer Si3N4.

Then, on the resulting structure having the spacer 108, impurities are ion-implanted in high concentration to form source/drain regions 110.

Figure 5:
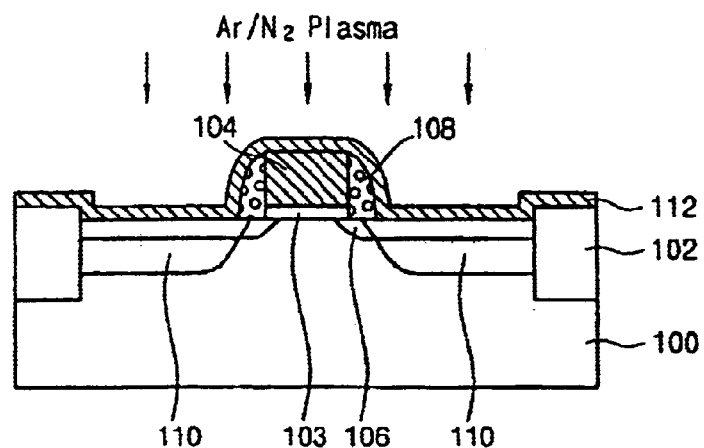

Referring to FIG. 5, a Ti layer 112 is deposited on the entire surface of the resulting structure as a lower metal layer. The Ti layer 112 has a thickness of 50~200 Å, a part of the Ti layer to be deposited.

Then, Ar or N2 gas is continuously supplied into a RF reaction chamber and then, excited into a plasma state to be injected into the lower Ti layer 112. Here, Ar or N2 gas is flowed at the rate of 10~40 sccm and the temperature of chamber is maintained at 300~400° C. to diffuse the component of Ar or N2 gas into the lower Ti layer 112. The plasma-treated lower Ti layer 112 has internal defects by the diffused gas.

Therefore, it is possible to generate nucleation of C54 phase which is stable and has low resistance, thereby forming a uniform silicide layer in a later silicide process.

Figure 6:
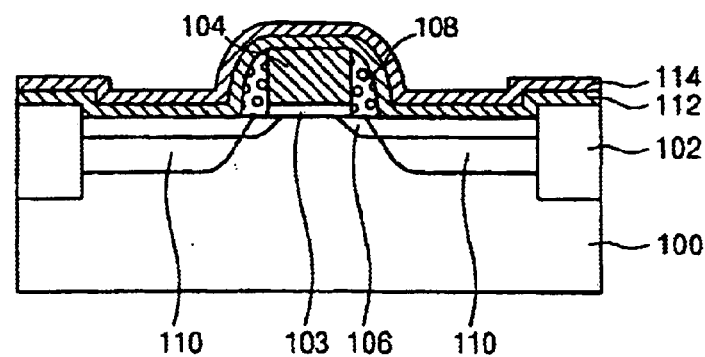

Referring to FIG. 6, a Ti is deposited on the upper part of the lower Ti layer 112 as an upper metal layer 114. The upper Ti layer 114 has a thickness of 100~300 Å, a remainder of the Ti layer to be deposited.

Figure 7:
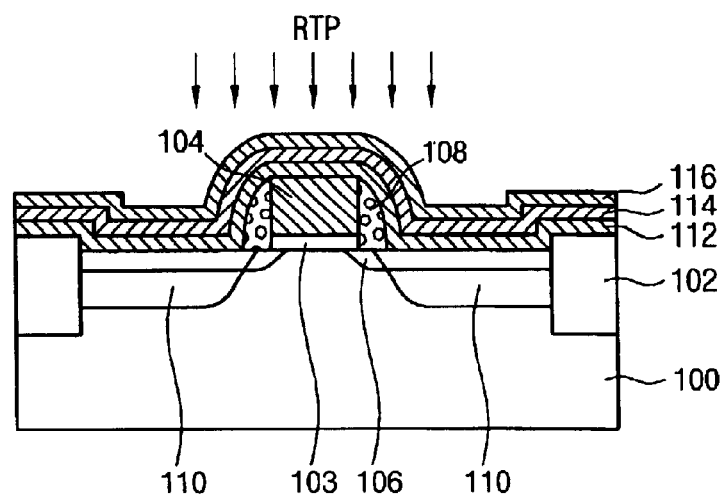

Referring to FIG. 7, a TiN layer 116 is deposited on the upper Ti layer 114 and then, a RTP process is performed to generate a silicide reaction.

Figure 8:
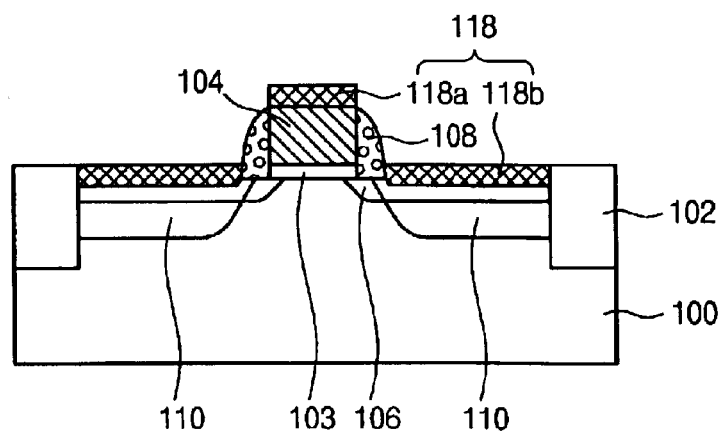

Referring to FIG. 8, silicide reaction is generated between silicon on the upper part of gate electrode 104 and source/drain regions 110 and lower/upper Ti layers 112,114 and TiN layer 116 by the RTP. Therefore, a Ti silicide layer (TiSix) 118 is formed on the surfaces thereof.

Then, unreacted lower/upper Ti layers 112,114 and TiN layer are removed to prevent Ti silicide layers 118a,118b of gate electrode 104 and source/drain regions 110 from being connected to each other.

That is, a first RTP is performed at a temperature of 650~750° C., thereby forming a silicide layer (TiSix) 118. Here, unstable C49 phase is easily formed by the lower Ti layer 112 having internal defects due to plasma treatment, thereby reducing the size of crystal grain. Then, a second RTP is performed at a temperature of 750~850° C. on the Ti silicide layer 118 of C49 phase having a reduced crystal grain. As a result, it is possible to generate nucleation of C54 phase which is stable and has low resistance in a crystal grain system of C49 phase, thereby forming a Ti silicide layer 118 of C54 uniformly and continuously.

AS described above, according to the present invention, the Ti layer is deposited by two stage process to form a silicide wherein Ar or N2 gas is excited into RF plasma state and injected in the first deposited Ti layer, thereby obtaining uniform silicde layers in a later thermal treatment process.

Therefore, although the line width of gate electrode is reduced in a highly-integrated semiconductor device, it is possible to uniformly and continuously form a Ti silicide layer of C54 phase, which is stable and has low resistance, on a gate electrode and source/drain regions. As a result, the semiconductor device has improved electrical properties and yield.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for manufacturing a silicide layer of semiconductor device comprising the steps of:
    depositing a lower metal layer on the surface of semiconductor substrate and then, performing a plasma treatment; and
    depositing an upper metal layer on the plasma-treated lower metal layer and then, performing a thermal treatment process, thereby forming a metal silicide layer on the surface of semiconductor substrate.

2. The method for manufacturing a silicide layer of semiconductor device according to claim 1, wherein the lower and upper metal layers are Ti.

3. The method for manufacturing a silicide layer of semiconductor device according to claim 2, wherein the lower metal layer has a thickness of 50~200 Å.

4. The method for manufacturing a silicide layer of semiconductor device according to claim 2, wherein the upper metal layer has a thickness of 100~300 Å.

5. The method for manufacturing a silicide layer of semiconductor device according to claim 2, wherein the plasma treatment is performed in a state that Ar or N2 gas is flowed at a rate of 10~40 sccm and the chamber is maintained at a temperature of 300~400° C.

6. The method for manufacturing a silicide layer of semiconductor device according to claim 2, wherein the thermal treatment comprises first thermal treatment and second thermal treatment.

7. The method for manufacturing a silicide layer of semiconductor device according to claim 6, wherein the first thermal treatment is performed at a temperature of 650~750° C.

8. The method for manufacturing a silicide layer of semiconductor device according to claim 6, wherein the second thermal treatment is performed at a temperature of 750~850° C.

9. The method for manufacturing a silicide layer of semiconductor device according to claim 7, wherein the metal silicide layer have C49 phase by the first thermal treatment.

10. The method for manufacturing a silicide layer of semiconductor device according to claim 8, wherein the metal silicide layer have C54 phase by the second thermal treatment.

11. The method for manufacturing a silicide layer of semiconductor device according to claim 1, further comprising a step of forming source/drain regions and a gate electrode on the semiconductor substrate.

12. A method for manufacturing a silicide layer of semiconductor device comprising the steps of:
    forming a gate electrode on a semiconductor substrate;
    forming a spacer on the sidewall of gate electrode;
    forming source/drain regions on both substrates of the gate electrode;
    forming a lower metal layer on the entire surface of the resulting structure and performing a plasma treatment; and
    forming an upper metal layer on the upper part of the plasma-treated lower metal layer and performing first and second thermal treatment processes, thereby forming a metal silicide layer on the gate electrode and source/drain.

13. The method for manufacturing a silicide layer of semiconductor device according to claim 12, wherein the lower and upper metal layers are Ti.

14. The method for manufacturing a silicide layer of semiconductor device according to claim 12, wherein the lower metal layer has a thickness of 50~200 Å.

15. The method for manufacturing a silicide layer of semiconductor device according to claim 12, wherein the upper metal layer has a thickness of 100~300 Å.

16. The method for manufacturing a silicide layer of semiconductor device according to claim 12, wherein the plasma treatment process is performed in a state that Ar or N2 gas is flowed in a reaction chamber at a rate of 10~40 sccm and the chamber is maintained at a temperature of 300~400° C.

17. The method for manufacturing a silicide layer of semiconductor device according to claim 12, wherein the first thermal treatment is performed at a temperature of 650~750° C. and the second thermal treatment is performed at a temperature of 750~850° C.

18. The method for manufacturing a silicide layer of semiconductor device according to claim 12, wherein the metal silicide layer have C49 phase by the first thermal treatment.

19. The method for manufacturing a silicide layer of semiconductor device according to claim 12, wherein the metal silicide layer have C54 phase by the second thermal treatment.

* * * * *